Figure 1:
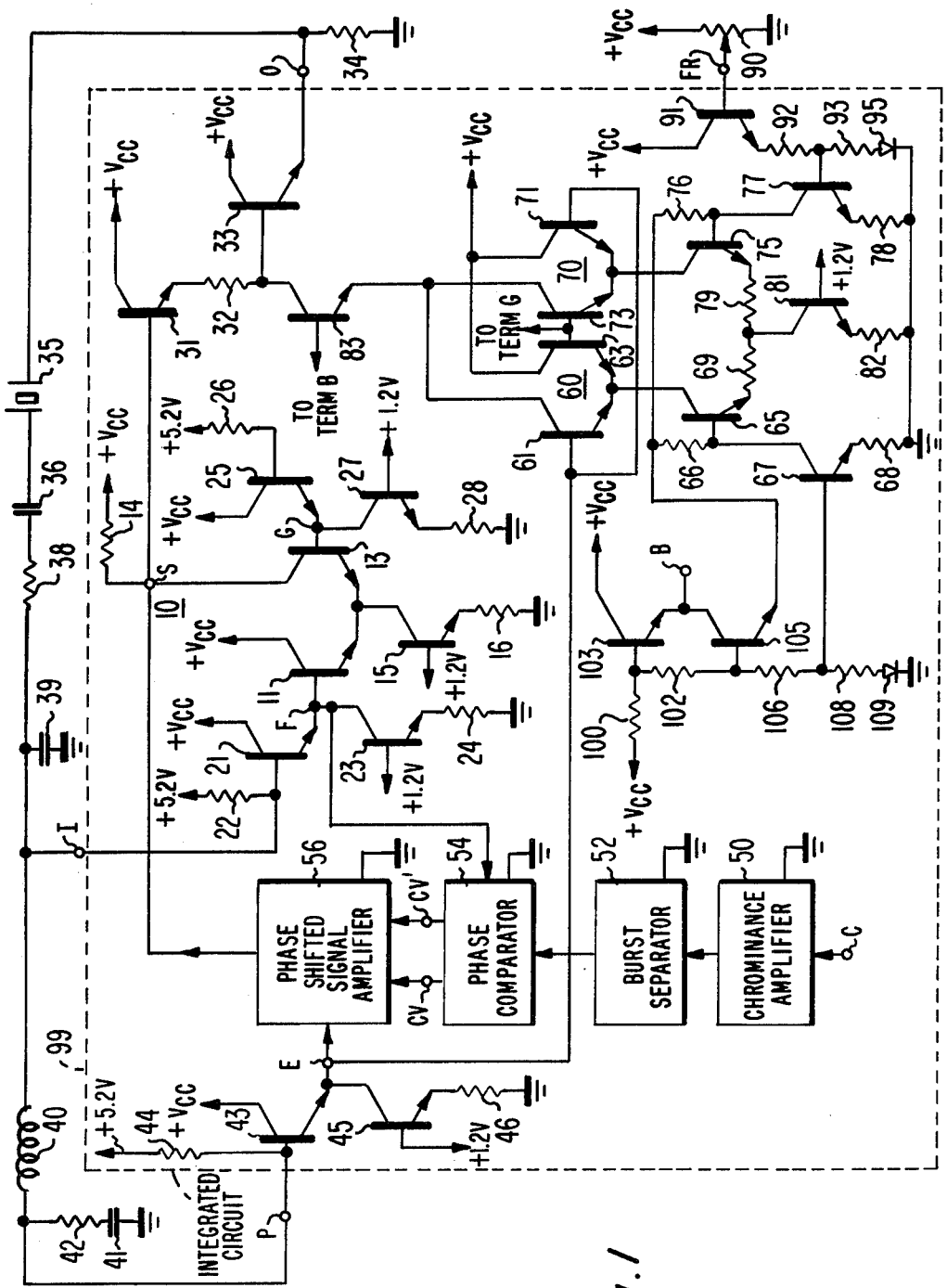

United States Patent [19]

Shanley, II et al.

[11] Patent Number: 4,485,354
[45] Date of Patent: Nov. 27, 1984

[54] PLL OSCILLATOR SYNCHRONIZING SYSTEM WITH DC CONTROL OF FREE-RUNNING FREQUENCY

[75] Inventors: Robert L. Shanley, II, Indianapolis, Ind.; Leopold A. Harwood, Bridgewater, N.J.

[73] Assignee: RCA Corporation, New York, N.Y.

[21] Appl. No.: 383,303

[22] Filed: May 28, 1982

[51] Int. Cl.³ .............................................. H03L 7/08
[52] U.S. Cl. ...................................... 331/8; 331/17; 331/20; 331/25; 358/19
[58] Field of Search ......................... 331/8, 17, 20, 25; 358/19

[56] References Cited

U.S. PATENT DOCUMENTS 3,857,110 12/1974 Grebene .............................. 331/8 X
3,869,679 3/1975 Grebene .................................. 331/8
4,020,500 4/1977 Harwood .............................. 358/19

OTHER PUBLICATIONS

Frerking, M. E. *Crystal Oscillator Design and Temperature Compensation*, Van Nostrand Reinhold Co., N.Y., 1978, p. 143.
Application notes concerning RCA CA3070 chroma IC, entitled "Television Chroma System–File No. 468", appearing at pp. 359-363 of the publication entitled RCA Linear Integrated Circuits, 1975 DATABOOK Series, SSD-201C.
Schematic for Blaupunkt FM-120 color TV receiver chassis, employing Motorola TDA 3300 luma-chroma IC.

*Primary Examiner*—Eugene R. Laroche
*Assistant Examiner*—D. C. Mis
*Attorney, Agent, or Firm*—Eugene M. Whitacre; Paul J. Rasmussen; William H. Meagher

[57] ABSTRACT

Color reference oscillator comprises a non-inverting amplifier, with positive feedback via a crystal filter linking its output and input. A quadrature phase shift network, coupled to the filter output, delivers phase shifted signals to a pair of independently controlled amplifiers. One of the controlled amplifiers is responsive to control voltage outputs of a burst-responsive phase detector so as to inject phase shifted signals into the oscillator loop, as and when required, to effect synchronization of oscillator with burst component of incoming color television signal. The second of the controlled amplifiers is responsive to a reference DC voltage and to a manually adjustable DC control voltage, and develops a phase shifted signal output, of a magnitude and polarity dependent upon the magnitude and sense of the difference, if any, between the respective DC voltages, for combination with the non-inverting amplifier's output. Variation of the manually adjustable control voltage effects an adjustment of the free-running frequency of the oscillator.

8 Claims, 2 Drawing Figures

PLL OSCILLATOR SYNCHRONIZING SYSTEM WITH DC CONTROL OF FREE-RUNNING FREQUENCY

The present invention relates generally to synchronized oscillators, and particularly to novel phase locked loop (PLL) oscillator synchronizing systems employing phase control apparatus to effect and maintain the desired synchronization, and incorporating a facility independent of said phase control apparatus which permits DC control of the oscillator's free-running frequency.

U.S. Pat. No. 4,020,500—Harwood discloses a synchronized oscillator of a general type which has been subject to widespread use as the color reference oscillator in color television receivers. The oscillator employs a non-inverting amplifier, with feedback via a crystal filter linking the output and input of the non-inverting amplifier. A quadrature phase shift network coupled to the filter output supplies phase shifted signals to an additional controlled amplifier. A phase detector, responsive to received color synchronizing bursts of reference oscillations and to signals from the non-inverting amplifier, develops control voltages representative of the magnitude and sense of the difference, if any, from a desired quadrature phase relationship between its inputs. The additional controlled amplifier supplies phase shifted signals to the non-inverting amplifier's load of a polarity and magnitude determined by the control voltages so as to minimize the aforesaid difference.

In the oscillator system disclosed in said U.S. Pat. No. 4,020,500, a variable capacitor coupled in series with the piezoelectric crystal of the feedback filter provides a facility for adjustment of the free-running frequency of the oscillator.

A variable capacitor appropriate for this purpose is a relatively expensive discrete component, with a potential for mechanical instability. In use of automatic alignment apparatus for efficient mass production of color receivers, achievement of accurate control of a variable capacitor by an alignment tool can pose awkward mechanical problems. An additional drawback to the variable capacitor approach to frequency control is that the variable capacitor constitutes a "hot" control, with the possibility that capacity associated with the alignment tool can lead to adjustments during automatic alignment that are incorrect for operation subsequent to tool removal.

The present invention is directed to an oscillator synchronizing system provided with a facility for effecting a "cold" DC control of the free-running frequency of the synchronized oscillator, whereby drawbacks associated with a variable capacitor approach to such frequency control may be avoided. In effecting a DC control of the free-running frequency of the synchronized oscillator pursuant to the principles of the present invention, however, the apparatus provided therefor is independent of the phase control loop employed for synchronization purposes, allowing adjustment of the free-running frequency to be carried out without any asymmetrical disturbance of the control range of the phase control loop. This contrasts with such examples of DC frequency control for the color reference oscillator as are provided in (a) the chroma system described on pages 359–363 of the RCA Linear Integrated Circuits volume SSD-201C, 1975 DATA BOOK Series, and (b) color TV receivers (e.g., Blaupunkt FM 120 chassis) of the type employing the Motorola TDA 3300 luma/chroma IC. In example (a), DC control of the free-running frequency is effected by introduction of a DC imbalance to the phase detector employed for burst synchronization purposes, whereas in example (b), DC control of the free-running frequency is effected by direct alteration of the filtered output of the burst-responsive phase detector.

In accordance with an illustrative embodiment of the present invention, the output of the quadrature phase shift network in an oscillator synchronizing system of the general type disclosed in the aforementioned U.S. Pat. No. 4,020,500 is supplied to a pair of independently controlled amplifiers. A first one of the controlled amplifiers is responsive to the control voltage outputs of a burst-responsive phase detector so as to effect synchronization of the oscillator in the general manner described in said U.S. patent. The second of the controlled amplifiers is responsive to a reference DC voltage and to an adjustable DC control voltage, and develops a phase shifted signal output of a magnitude and polarity dependent upon the magnitude and sense of the difference, if any, between the respective DC voltages. Combination of this phase shifted signal output with the non-inverting amplifier's output effects an adjustment of the free-running frequency of the oscillator without disturbance of the symmetry of the phase control range associated with the operation of the first controlled amplifier.

Figure 2:
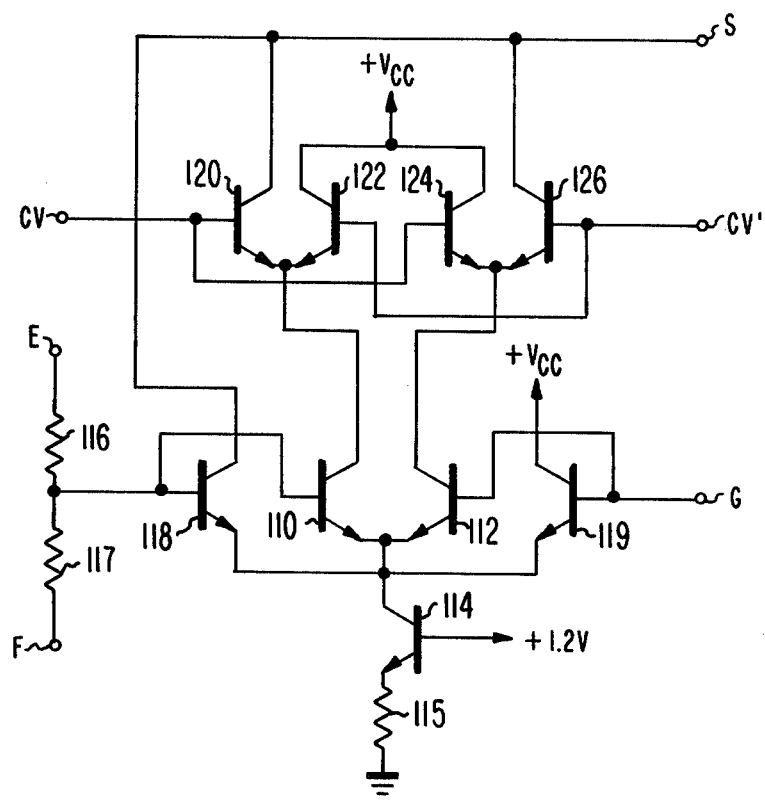

In the accompanying drawings:

FIG. 1 illustrates, partially schematically and partially by block representation, a portion of a color television receiver incorporating a color reference oscillator synchronizing system wherein free-running frequency control adjustment is effected pursuant to an illustrative embodiment of the present invention; and FIG. 2 illustrates schematically circuitry for use in an advantageous modification of the apparatus of FIG. 1.

In the color television receiver portion illustrated in FIG. 1, a non-inverting amplifier 10 is provided with sufficient positive feedback via a bandpass filter linking its output and input to enable it to operate as an oscillator at an operating frequency lying within the filter's passband.

Amplifier 10 includes a pair of NPN transistors 11 and 13, disposed in a differential amplifier configuration with their emitter electrodes interconnected. The collector electrode of the input transistor (11) of the differential amplifier is directly connected to the positive terminal (+Vcc) of an operating potential supply, while the collector electrode of the output transistor (13) of the differential amplifier is connected to the +Vcc terminal via a load resistor 14. The interconnected emitter electrodes of transistors 11 and 13 are returned to the negative terminal (e.g., ground) of the operating potential supply via the collector-emitter path of an NPN current source transistor 15 in series with its emitter resistor 16.

Signals are applied from the amplifier input terminal I to the base electrode of the input transistor 11 via the base-emitter path of an NPN emitter-follower transistor 21. Signals are applied from terminal S at the collector electrode of output transistor 13 to the amplifier output terminal 0 via the base-emitter paths of a pair of NPN emitter-follower transistors 31 and 33, which are interconnected by a resistor 32 linking emitter electrode of transistor 31 to the base electrode of transistor 33. The emitter electrode of transistor 33 is returned to ground via resistor 34. The collector electrodes of emitter-follower transistors 21, 31, 33 are each directly connected to the +Vcc supply terminal.

Bias for the base electrode of output transistor 13 is established by an NPN emitter-follower transistor 25, disposed with its collector electrode directly connected to the +Vcc supply terminal, with its base electrode connected via a resistor 26 to the positive terminal (+5.2 V.) of a bias supply, and with its emitter electrode directly connected to the base electrode of output transistor 13. The quiescent current drawn by emitter-follower transistor 25 is determined by an NPN current source transistor 27, disposed with its collector electrode directly connected to the emitter electrode of transistor 25 and its emitter electrode returned to ground via resistor 28. The quiescent current drawn by the emitter-follower transistor 21 at the amplifier input is similarly determined by an NPN current source transistor 23, disposed with its collector electrode directly connected to the emitter electrode of transistor 21 and its emitter electrode returned to ground via resistor 24. A resistor 22 couples the base electrode of transistor 21 to the +5.2 V. bias supply terminal. The base electrodes of current source transistors 15, 23 and 27 are each directly connected to the positive terminal (+1.2 V.) of an additional bias supply.

Amplifier output terminal 0 is linked to the amplifier input terminal I by the series combination of a piezoelectric crystal 35, a fixed capacitor 36, and a resistor 38. Illustratively, crystal 35 is cut so as to exhibit series resonance at a frequency in the immediate vicinity of, but slightly below, the color subcarrier frequency (e.g., 3.579545 MHz.) of the color television signals to which the receiver responds. Accordingly, crystal 35 appears inductive at the color subcarrier frequency. The value of the fixed capacitor 36 is chosen so that the series combination of elements 35 and 36 nominally exhibits series resonance at the color subcarrier frequency, with the Q of the resonant system determined by the resistance value of the series resistor 38 to establish a suitable bandwidth (e.g., 1000 Hz.) for the bandpass filter characteristic of the feedback path. A capacitor 39, coupled between terminal I and ground, cooperates with resistor 38 to provide significant attenuation for harmonics of the desired operation frequency to substantially preclude the sustaining of oscillations at such higher frequencies. The bandpass characteristic provided by elements 35 and 36 allows positive feedback of an oscillation-sustaining magnitude in the immediate vicinity of the color subcarrier frequency. A precise match of the free-running operating frequency to the color subcarrier frequency is not assured, however, because of practical tolerances associated with elements 35 and 36. As will be subsequently described, the system of FIG. 1 includes additional apparatus permitting adjustment of the free-running operating frequency to a desired precise frequency.

For the purpose of synchronizing the above-described oscillator in frequency and phase with a color subcarrier reference of incoming color television signals, the system of FIG. 1 includes a phase comparator 54. The local input to phase comparator 54 comprises oscillations derived from terminal F at the base electrode of input transistor 11. A chrominance amplifier 50 is responsive to the chrominance component of incoming signals, appearing at terminal C and inclusive of periodic synchronizing bursts of oscillations of color subcarrier frequency and a reference phase. An output of chrominance amplifier 50 is supplied to a burst separator 52, which delivers separated color synchronizing bursts to the other input of phase comparator 54.

Phase comparator 54 functions to develop a control voltage output having a magnitude and polarity indicative of the magnitude and sense of whatever difference from the desired quadrature phase relationship may exist between the respective comparator inputs. Illustratively, phase comparator is of the type developing push-pull outputs, providing complementary control voltages at respective output terminals CV and CV'. These control voltages are used to control the operation of a phase shifted signal amplifier 56 which shares load resistor 14 with the non-inverting amplifier 10.

Signals for application to the input terminal (E) of amplifier 56 are derived from the output terminal (P) of a phase shifter 40, 42, 41. The phase shifter includes an inductor 40 connected between the amplifier input terminal I and the phase shifter output terminal P, and the series combination of resistor 42 and capacitor 41 connected between terminal P and ground. The values of the phase shifter elements are chosen so that a lagging phase shift (equal to substantially 90° at the color subcarrier frequency) is imparted to oscillations supplied from terminal I. The phase shifted oscillations appearing at the phase shifter output terminal P are coupled to the input terminal E of amplifier 56 via the base-emitter path of an NPN emitter-follower transistor 43, disposed with its collector electrode directly connected to the +Vcc terminal, with its base electrode directly connected to terminal P and with its emitter electrode directly connected to terminal E. The quiescent current drawn by transistor 43 is determined by an NPN current source transistor 45, disposed with its collector electrode directly connected to the transistor 43 emitter, with its base electrode directly connected to the +1.2 V. bias supply terminal and with its emitter electrode connected to ground via resistor 46.

A suitable configuration for implementation of the function of phase shifted signal amplifier 56 is shown, for example, in the aforementioned U.S. Pat. No. 4,020,500. In operation, when no difference from the desired quadrature phase relationship exists between the respective inputs to phase comparator 54, amplifier 56 develops no signal output and the free-running operation of the local color oscillator is undisturbed. When a difference of one sense from said desired quadrature phase relationship exists, amplifier 56 develops an inverted version of the phase shifted signals appearing at terminal E across the shared load resistor 14, of a magnitude dependent upon the magnitude of the phase difference. When a difference from said desired quadrature phase relationship of the opposite sense exists, amplifier 56 develops a non-inverted version of said phase shifted signals across resistor 14, of a magnitude dependent upon the magnitude of the phase difference. The effect of such controlled injection of phase shifted signals is alteration of the oscillator operation in a sense to minimize the departure from the desired quadrature phase relationship between the comparator inputs so as to effect synchronization of the oscillator with the received color synchronizing bursts.

Pursuant to the principles of the present invention, an additional use is made of the phase shifted signals appearing at terminal E to effect adjustment of the free-running frequency of the above-described oscillator. For this purpose, the phase shifted signals appearing at terminal E are supplied as inputs to a pair of differential amplifiers 60 and 70.

Differential amplifier 60 includes a pair of NPN transistors 61, 63 with interconnected emitter electrodes, while differential amplifier 70 includes a pair of NPN transistors 71, 73 with interconnected emitter electrodes. The base electrodes of transistors 61 and 71 are directly connected to terminal E at which the aforementioned phase shifted signals appear. The base electrodes of transistors 63 and 73 are maintained at an appropriate bias potential via their direct connection to terminal G (at the base electrode of transistor 13). The collector electrodes of transistors 63 and 71 are directly connected to the +Vcc supply terminal, while the collector electrodes of transistors 61 and 73 are directly connected to the emitter electrode of an NPN transistor 83, the collector of which is directly connected to the base electrode of transistor 33 (the output emitter-follower of the non-inverting amplifier 10 that develops the color reference oscillations). A direct current path between the collector electrode of transistor 83 and the +Vcc supply terminal is provided by the series combination of resistor 32 and the emitter-collector path of emitter-follower transistor 31.

It will be seen that differential amplifier 60 is disposed to add an inverted version of the phase shifted signals from terminal E to the output of the non-inverting amplifier 10, whereas differential amplifier 70 is disposed to add a non-inverted version of the phase shifted signals from terminal E to the output of the non-inverting amplifier 10. If the gains of differential amplifiers 60 and 70 are equal, their respective outputs mutually cancel so that no injection of phase shifted signals into the oscillator loop is effected. If, however, the gains of differential amplifiers 60, 70 differ, phase shifted signal injection occurs, with the magnitude of the signal injection dependent upon the magnitude of gain difference, and the relative polarity of the injected signals dependent upon the sense of the gain difference.

Differential gain control of the respective amplifiers 60 and 70 is effected by a gain control system which includes a pair of NPN transistors 65 and 75 disposed with their emitter electrodes interconnected via the series combination of resistors 69 and 79. Current is supplied to the emitter electrodes of transistors 65 and 75 by an NPN current source transistor 81 disposed with its collector electrode directly connected to the junction of resistors 69 and 79, with its base electrode directly connected to the +1.2 V. bias supply terminal, and with its emitter electrode returned to ground via resistor 82. Transistor 65, disposed with its collector electrode directly connected to the interconnected emitter electrodes of transistors 61 and 63, serves as a current source for differential amplifier 60. Transistor 75, disposed with its collector electrode directly connected to the interconnected emitter electrodes of transistors 71 and 73, serves as a current source for differential amplifier 70.

A voltage divider provided for bias supply purposes includes the series combination of resistor 100, resistor 102, resistor 106, resistor 108, and diode 109, connected between the +Vcc supply terminal and ground. Bias for the base electrode of transistor 83 is supplied from the junction of divider resistors 100, 102 via the base-emitter path of an NPN emitter-follower transistor 103. Transistor 103 is disposed with its collector electrode directly connected to the +Vcc supply terminal, with its base electrode directly connected to the aforementioned resistor junction, and with its emitter electrode (terminal B) directly connected to the base electrode of transistor 83. A lower voltage point on the divider, at the junction of resistors 102 and 106, is connected via the base-emitter path of an additional NPN emitter-follower transistor 105, in series with respective dropping resistors 66 and 76 (of substantially matched value), to the base electrodes of the respective gain controlling transistors 65 and 75. Transistor 105 is disposed with its collector electrode directly connected to terminal B, with its base electrode directly connected to the junction of divider resistors 102, 106, and with its emitter electrode directly connected to the junction of dropping resistors 66, 76.

The current drawn through dropping resistor 66 is determined by an NPN current source transistor 67 disposed with its collector electrode directly connected to the base electrode of transistor 65, with its base electrode directly connected to the junction of divider resistors 106 and 108, and with its emitter electrode returned to ground via resistor 68. The voltage drop across resistor 66 determined by this current establishes a reference DC potential at the base electrode of transistor 65.

The current drawn through dropping resistor 76 is adjustable in magnitude, as determined by adjustment of the biasing of an NPN current source transistor 77, of a construction substantially identical to that of current source transistor 67, and disposed with its collector electrode directly connected to the base electrode of transistor 75, and with its emitter electrode returned to ground via resistor 78 (substantially matched in value with resistor 68). For control of the bias applied to the base electrode of current source transistor 77, a potentiometer 90 is provided, with its fixed end terminals connected to the +Vcc supply terminal, and to ground, respectively, and with its adjustable tap (terminal FR) directly connected to the base electrode of an NPN emitter-follower transistor 91. Transistor 91 is disposed with its collector electrode directly connected to the +Vcc supply terminal, and with its emitter electrode returned to ground via the series combination of resistor 92, resistor 93 and diode 95. The junction of resistors 92 and 93 is directly connected to the base electrode of current source transistor 77.

Elements 91, 92, 93, 95 form a level shifting circuit serving to translate the +Vcc-to-ground voltage adjustment range at terminal FR to a narrower, differently centered range at the base electrode of transistor 77. Illustratively, the parameters of the level shifting circuit are selected so that the voltage adjustment range at the base electrode of transistor 77 is centered about a voltage substantially matching the divider output voltage supplied to the base electrode of transistor 67. With potentiometer 90 constructed as a linear potentiometer, a desirable result of such parameter selection is that adjustment of the potentiometer tap near a midpoint position results in biasing of the base electrode of gain controlling transistor 75 at a potential equal to the reference DC potential at which the base electrode of gain controlling transistor 65 is maintained.

Under the aforementioned conditions of equality of potential at the base electrodes of transistors 65 and 75, the current supplied by current source transistor 81 splits equally between transistors 65 and 75, with the consequence that the gains of differential amplifiers 60 and 70 are equal. Under these conditions, there is no injection of phase shifted signals into the oscillator loop, and the free-running frequency of the oscillator formed by non-inverting amplifier 10 and its associated positive feedback path is left undisturbed. Where said undisturbed free-running frequency precisely matches the desired color subcarrier frequency, no repositioning of the potentiometer tap is required. Where, however, the undisturbed free-running frequency differs from the desired color subcarrier frequency, the free-running frequency may be adjusted to the correct frequency by a movement of the adjustable tap away from the balance setting.

When the undisturbed free-running frequency is lower than the desired color subcarrier frequency, movement of the potentiometer tap away from the balance setting toward a more positive DC potential setting is appropriate. Such an adjustment increases the current drawn through resistor 76 relative to that drawn through resistor 66, unbalancing the bias potentials on the base electrodes of the gain controlling transistors 65, 75 in a sense increasing the current supplied to differential amplifier 60 while decreasing the current supplied to differential amplifier 70. Under these conditions, the output of differential amplifier 60 predominates, and injection of a leading quadrature component into the oscillator loop occurs. The operation of the oscillator will thereafter stabilize at a higher operating frequency than was obtained in its undisturbed state, with the magnitude of frequency increase dependent upon the magnitude of injected leading quadrature component as determined by the degree of gain imbalance introduced.

Conversely, when the undisturbed free-running frequency is higher than the desired color subcarrier frequency, movement of the potentiometer tap away from the balance setting toward a less positive DC potential setting is appropriate. Such an adjustment decreases the current drawn through resistor 76 relative to that drawn through resistor 66, with the consequence that the output of differential amplifier predominates so as to inject a lagging quadrature component into the oscillator loop.

The above-described apparatus thus permits use of potentiometer 90 as a "cold" DC control of the free-running frequency of the color reference oscillator. The free-running frequency control apparatus is independent of the phase control loop employed for burst synchronization purposes, and its adjustment does not disturb the symmetry of the phase control range associated with that loop.

As described above, the phase shifted signal amplifier 56 employed for burst synchronization purposes processes only phase shifted signals from the output of the phase shifter 40, 42, 41, and is illustratively of the configuration shown in U.S. Pat. No. 4,020,500. FIG. 2 illustrates a modification of such apparatus which is preferably employed in implementing the function of the phase shifted amplifier 56. The modified form of phase shifted amplifier 56 shown in FIG. 2 processes the resultant of matrixing signals from the phase shifter input with the phase shifted signals from the output of the phase shifter, in the manner shown, for example, in the copending U.S. patent application, Ser. No. 383,263, of T. Fang, et al., entitled PLL Oscillator Synchronizing System With Matrix For Phase Correction and filed concurrently herewith.

In FIG. 2, a pair of NPN transistors 110 and 112 are disposed as a differential amplifier with interconnected emitter electrodes returned to ground via the collector-emitter path of NPN current source transistor 114 in series with its emitter resistor 115. The base electrode of transistor 114 is directly connected to the +1.2 V. bias supply terminal. Phase shifted signals from terminal E (FIG. 1) are applied to the base electrode of transistor 110 via a matrixing resistor 116. Signals from terminal F, at the input of the non-inverting amplifier 10 of the FIG. 1 system, are also applied to the base electrode of transistor 110 via a matrixing resistor 117. Bias is applied to the base electrode of transistor 112 from terminal G (FIG. 1).

The collector electrode of transistor 110 supplies an inverted version of the matrixed signals appearing at the base electrode of transistor 110 to the interconnected emitter electrodes of NPN transistors 120 and 122 via a direct connection thereto. The collector electrode of transistor 112 supplies a non-inverted version of the matrixed signals appearing at the base electrode of transistor 110 to the interconnected emitter electrodes of NPN transistors 124 and 126 via a direct connection thereto. The control potential output appearing at output terminal CV of the phase comparator 54 of the FIG. 1 system is supplied to the base electrodes of transistors 120 and 124, while the complementarily varying control potential output appearing at output terminal CV' is supplied to the base electrodes of transistors 122 and 126.

The collector electrodes of transistors 122 and 24 are directly connected to the +Vcc supply terminal, while the collector electrodes of transistors 120 and 126 are directly connected to terminal S of the FIG. 1 system so as to develop outputs across the shared load resistor 14 shown therein. Also developing an output across resistor 14 is an additional NPN transistor 118, disposed with its base-emitter path directly in shunt with the base-emitter path of the differential amplifier transistor 110, and with its collector electrode directly connected to terminal S. The base-emitter path of differential amplifier transistor 112 is directly shunted by the base-emitter path of a further NPN transistor 119, which is disposed with its collector electrode directly connected to the +Vcc supply terminal.

As explained more fully in the aforementioned copending Fang, et al. patent application, delivery of an inverted version of the matrixed signals from terminals E and F to terminal S via transistor 118 serves to counteract adverse effects on the free-running oscillator operation of a phase shift that is associated with stray capacitance at terminal S. Also, use of the same matrixed signals for the controlled processing effected by the amplifier system 110, 112, 120, 122, 124, 126 allows attainment of symmetry of phase control in the synchronizing system despite the presence of the aforesaid phase shift. With use of the free-running frequency control technique of the present invention, such attained symmetry is not disturbed by any free-running frequency adjustment that may be required.

Illustratively, the schematically illustrated elements of the FIG. 1 system, with the exception of elements 34, 35, 36, 38, 39, 40, 41, 42, and 90 are desirably realized on a common integrated circuit 99, together with elements implementing the functions of amplifier 56, comparator 54, separator 52, and amplifier 50. In the instance of such a realization, terminals P, I, 0, and FR serve as integrated circuit terminals interfacing with off-chip components. In such an instance, terminals CV and CV' may also constitute integrated circuit terminals interfacing with off-chip control potential filtering elements (not illustrated).

Illustrative values for circuit parameters of FIGS. 1 and 2 are as follows:

| | |
|---|---|
| Resistors 14, 32 | 1500 ohms |
| Resistor 16 | 500 ohms |
| Resistors 22, 26, 44 | 10 kilohms |
| Resistors 24, 28, 46 | 1.67 kilohms |
| Resistor 34 | 4700 ohms |
| Resistor 38 | 1300 ohms |
| Resistors 42, 82 | 390 ohms |
| Resistors 66, 76 | 8.8 kilohms |
| Resistors 68, 78 | 5 kilohms |
| Resistors 69, 79 | 780 ohms |
| Resistor 93 | 2 kilohms |
| Resistor 92 | 16.5 kilohms |
| Resistor 100 | 9.8 kilohms |
| Resistor 102 | 4 kilohms |
| Resistor 106 | 6.2 kilohms |
| Resistor 108 | 1 kilohm |
| Resistor 115 | 260 ohms |
| Resistor 116 | 1.8 kilohms |
| Resistor 117 | 3.2 kilohms |
| Potentiometer 90 | 1 kilohm |
| Capacitor 36 | 18 picofarads |
| Capacitor 39 | 62 picofarads |
| Capacitor 41 | 120 picofarads |
| Inductor 40 | 33 microhenries |
| Vcc | 11.2 volts |

What is claimed is:

1. In an oscillator synchronizing system including (1) an oscillator comprising a non-inverting amplifier having an input terminal and an output terminal, and a band pass filter electrically coupled between said output terminal and said input terminal; (2) a phase shifter having an input terminal electrically coupled to receive signals from said non-inverting amplifier, and having an output terminal; (3) a phase comparator, having a first input terminal electrically coupled to receive signals from said non-inverting amplifier, and a second input terminal electrically coupled to receive a reference oscillatory signal, said phase comparator developing a first control voltage having an amplitude and polarity indicative of the magnitude and sense of the departure, if any, from a quadrature phase relationship between the respective signals appearing at its input terminals; and (4) controlled means, responsive to signals appearing at said phase shifter output terminal and to said first control voltage, for delivering phase shifted signals to said output terminal of said non-inverting amplifier with an amplitude and polarity dependent upon the amplitude and polarity of said first control voltage; apparatus for adjusting the free-running frequency of said oscillator comprising:

an adjustable DC voltage source for providing a second control voltage of an adjustable magnitude;

means, independent of said controlled means and responsive to signals appearing at said phase shifter output terminal, to said second control voltage, and to a reference DC voltage, for developing additional phase shifted signals of a magnitude and polarity dependent upon the magnitude and sense of the difference, if any, between the respective magnitudes of said second control voltage and said reference DC voltage; and means for supplying said additional phase shifted signals to said output terminal of said non-inverting amplifier.

2. A system in accordance with claim 1, for use in a color television receiver, wherein said reference oscillatory signal comprises received color synchronizing bursts of oscillations of a color subcarrier frequency, and wherein said bandpass filter exhibits a pass band encompassing said color subcarrier frequency.

3. A system in accordance with claim 2 wherein said bandpass filter comprises a piezoelectric crystal cut to exhibit series resonance in the immediate vicinity of said color subcarrier frequency.

4. A system in accordance with claim 3 wherein said bandpass filter additionally includes a fixed capacitor serially disposed with said crystal between said output and input terminals of said non-inverting amplifier.

5. A system in accordance with claim 4 wherein said phase shifter imparts a phase shift of substantially 90° at said color subcarrier frequency.

6. Apparatus in accordance with claim 5 wherein said first input terminal of said phase comparator is electrically coupled to said input terminal of said non-inverting amplifier.

7. A system in accordance with claims 1 or 6 wherein said additional phase shifted signal developing means includes a first differential amplifier comprising first and second transistors having respective emitter electrodes electrically connected to a fist junction, a second differential amplifier comprising third and fourth transistors having respective emitter electrodes electrically connected to a second junction, means for electrically coupling the base electrodes of said first and third transistors to said output terminal of said phase shifter, a fifth transistor having a collector electrode electrically connected to said first junction, a sixth transistor having a collector electrode electrically connected to said second junction, a source of substantially constant current electrically connected between a third junction and a point of reference potential, said fifth and sixth transistors having respective emitter electrodes electrically connected to said third junction, means for rendering the base electrode of said fifth transistor responsive to said reference DC potential, and means for rendering the base electrode of said sixth transistor responsive to said second control voltage, the input of said additional phase shifted signal supplying means being electrically coupled to the collector electrodes of said first and fourth transistors.

8. A system in accordance with claim 7 wherein said additional phase shifted signal supplying means includes a seventh transistor having its emitter electrode electrically connected to said collector electrodes of said first and fourth transistors, and its collector electrode electrically coupled to said output terminal of said non-inverting amplifier.

* * * * *